United States Patent
O'Meara et al.

(10) Patent No.: US 11,417,526 B2
(45) Date of Patent: Aug. 16, 2022

(54) MULTIPLE PATTERNING PROCESSES

(71) Applicant: Tokyo Electron Limited, Tokyo (JP)

(72) Inventors: David L. O'Meara, Albany, NY (US);
Eric Chih-Fang Liu, Albany, NY (US);
Jodi Grzeskowiak, Albany, NY (US);
Anton deVilliers, Albany, NY (US);
Akiteru Ko, Albany, NY (US);
Anthony Dip, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 12 days.

(21) Appl. No.: 16/780,248

(22) Filed: Feb. 3, 2020

(65) Prior Publication Data

US 2021/0242020 A1  Aug. 5, 2021

(51) Int. Cl.
*H01L 21/033* (2006.01)

(52) U.S. Cl.
CPC ...... *H01L 21/0337* (2013.01); *H01L 21/0338* (2013.01)

(58) Field of Classification Search
CPC .......................... H01L 21/0337; H01L 21/0338
See application file for complete search history.

(56) References Cited

U.S. PATENT DOCUMENTS

| | | | |
|---|---|---|---|
| 10,260,150 B2 | 4/2019 | Luong et al. | |
| 10,685,838 B1 | 6/2020 | Shiliang et al. | |
| 2014/0024209 A1* | 1/2014 | Jung | H01L 21/3088 438/595 |
| 2014/0120728 A1 | 5/2014 | Raley et al. | |
| 2015/0118850 A1* | 4/2015 | Peng | H01L 21/31116 438/703 |
| 2016/0104613 A1* | 4/2016 | Takeshita | H01L 21/02274 438/703 |
| 2016/0293438 A1 | 10/2016 | Zhou et al. | |
| 2016/0307772 A1 | 10/2016 | Choi et al. | |
| 2016/0365425 A1* | 12/2016 | Chen | H01L 21/02178 |

FOREIGN PATENT DOCUMENTS

WO  2018048594 A1  3/2018

* cited by examiner

*Primary Examiner* — Walter H Swanson
(74) *Attorney, Agent, or Firm* — Slater Matsil, LLP (57) ABSTRACT

A method of forming a device includes depositing a first etch mask layer over a mandrel formed using a lithography process. The method includes depositing a second etch mask layer over the first etch mask layer. The method includes, using a first anisotropic etching process, etching the first etch mask layer and the second etch mask layer to form an etch mask including the first etch mask layer and the second etch mask layer. The method includes removing the mandrel to expose an underlying surface of the layer to be patterned. The method includes, using the etch mask, forming a feature by performing a second anisotropic etching process to pattern the layer to be patterned, where during the first anisotropic etching process, the first etch mask layer etches at a first rate and the second etch mask layer etches at a second rate, and where the first rate is different from the second rate.

20 Claims, 10 Drawing Sheets

MULTIPLE PATTERNING PROCESSES

TECHNICAL FIELD

The present invention relates generally to semiconductor fabrication, and, in particular embodiments, to multiple patterning processes.

BACKGROUND

Multiple patterning techniques such as Self-Aligned Quadruple Patterning (SAQP) are increasingly being used for scaling semiconductor features below photolithographic limits. The minimum resolution attainable with a single lithographic exposure is limited, amongst other things, by the wavelength of light used. However, it has become extremely difficult to scale the wavelength of the radiation. Multiple patterning techniques help to double pitch (for each additional patterning) and thus help to achieve feature sizes that are otherwise unattainable. However, these techniques rely on repeated lithography steps, which can cause amplification of abnormalities introduced during the process.

SUMMARY

A method of forming a device includes forming a mandrel layer over a layer to be patterned and patterning the mandrel layer to form a mandrel using a lithography process. The method includes depositing a first etch mask layer over the mandrel. The method includes depositing a second etch mask layer over the first etch mask layer. The method includes, using a first anisotropic etching process, etching the first etch mask layer and the second etch mask layer to form an etch mask including the first etch mask layer and the second etch mask layer. The method includes removing the mandrel to expose an underlying surface of the layer to be patterned. The method includes, using the etch mask, forming a feature by performing a second anisotropic etching process to pattern the layer to be patterned, where during the first anisotropic etching process, the first etch mask layer etches at a first rate and the second etch mask layer etches at a second rate, and where the first rate is different from the second rate.

A method of forming a device includes forming a mandrel over a layer to be patterned and depositing a first etch mask layer over the mandrel. The method includes, using a first anisotropic etching process, etching the first etch mask layer to form a spacer on the mandrel. The method includes depositing a second etch mask layer over the first etch mask layer and the mandrel. The method includes, using a second anisotropic etching process, etching the second etch mask layer to form a liner over the spacer. The method includes removing the mandrel to expose an underlying surface of the layer to be patterned. The method includes, using a third anisotropic etching process, etching the spacer and the liner to form an etch mask including the first etch mask layer and the second etch mask layer. The method includes, using the etch mask, forming a feature by performing a fourth anisotropic etching process to pattern the layer to be patterned. During the third anisotropic etching process, the first etch mask layer etches at a first rate and the second etch mask layer etches at a second rate, and where the first rate is different from the second rate.

A method of forming a device includes forming a mandrel over a layer to be patterned and forming a spacer along sidewalls of the mandrel. The spacer includes a first sidewall including a first material and a second sidewall including a second material different from the first material. The first sidewall and the second sidewall are vertical and parallel to each other. The method includes removing the mandrel after forming the spacer. The method includes, using the spacer as an etch mask, forming a feature in the layer to be patterned using an anisotropic etching process.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2A-4B illustrate a semiconductor device cross section during various stages of fabrication in accordance with an embodiment of the present invention, wherein

FIGS. 5A-6B illustrate a semiconductor device during various stages of fabrication in accordance with another embodiment of the present invention, wherein FIGS. 5A-5B illustrate the fabrication process for the semiconductor device after forming multiple conformal layers over a mandrel, wherein

FIGS. 8A-10B illustrate a semiconductor device during various stages of fabrication in accordance with embodiments of the present invention, wherein FIGS. 8A-10A illustrate the cross-sectional views and FIGS. 8B-10B illustrate the top views, FIG. 8A-8B illustrate a semiconductor device during fabrication after etching the first etch mask layer with a first anisotropic etch process so as to form an intermediate spacer structure, wherein FIGS. 9A-9B illustrate a semiconductor device during fabrication after etching the second etch mask layer to expose a top surface of the mandrel and after subsequently removing the mandrel, wherein

The drawings are not necessarily drawn to scale. The drawings are merely representations, not intended to portray specific parameters of the invention. The drawings are intended to depict only specific embodiments of the inventions, and therefore should not be considered as limiting in scope. In the drawings, like numbering represents like elements.

DETAILED DESCRIPTION OF ILLUSTRATIVE EMBODIMENTS

The structure, method, and using of various embodiments of an electronic device are discussed in detail below. However, it should be valued that the various embodiments detailed herein may be applicable in a wide variety of disciplines. The specific embodiments described herein are merely illustrative of specific ways to make and use various embodiments, and should not be construed in a limited scope.

Semiconductor scaling to smaller dimensions has caused the use of new lithography techniques such as electron beam lithography and extreme ultraviolet (EUV) lithography. However, even using such techniques, additional multiple patterning techniques such as double or quadruple patterning are also used. In such multiple patterning techniques, the shape of the spacer around the mandrel determines the underlying feature being formed. Rounded corners or foots if present in the spacer can propagate into the underlying pattern that is being formed causing infirmities. These infirmities when passed on to subsequent features can impact process yield due to device degradation as well as due to increased variation.

Embodiments of the present application enable the use of advanced lithography techniques by reducing or even eliminating the infirmities on spacers by using a multilayer spacer composition. In various embodiments, the composition of the spacer is tailored to offset for deviations in the spacer etch process.

Figure 1A:
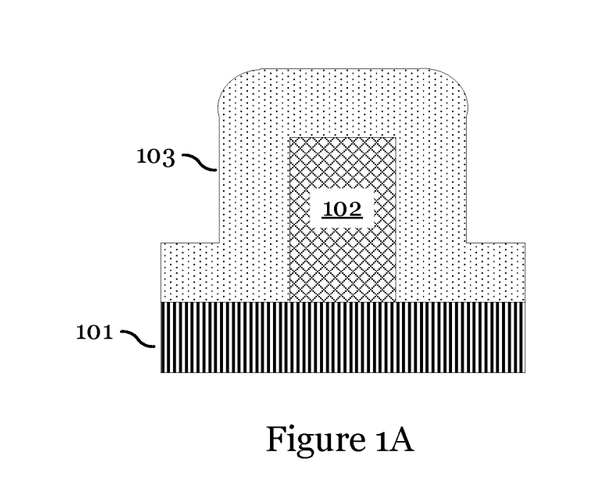
FIGS. 1A-1C illustrate cross-sectional views of a semiconductor device in accordance with a typical Spacer or Self Aligned Double Patterning (SADP) process flow.
Figure 1B:
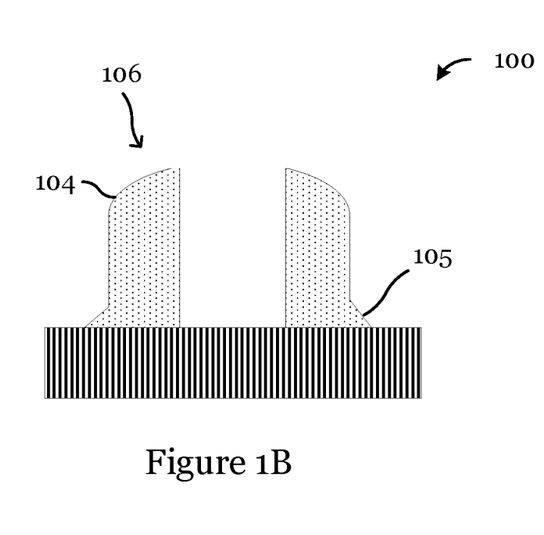
Figure 1C:
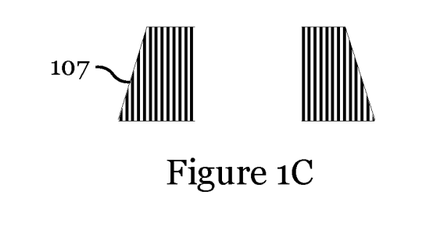

FIGS. 1A-1C illustrate cross-sectional views of a semiconductor device 100 during fabrication in accordance with a typical process flow.

FIG. 1A illustrates the formation of a mandrel 102 over a substrate 101, followed by a conformal deposition of a first layer 103 over the mandrel 102. The mandrel 102 may be a feature that has a critical dimension of the minimum feature size that is obtainable only with a single step lithographic process using extreme ultraviolet (EUV) lithography or electron beam lithography. The deposition thickness of the first layer 103 constitutes the pattern feature critical dimension, which although theoretically can be scaled to atomic layer dimensions is limited in practice as described below.

FIG. 1B illustrates the subsequent formation of a mask 106 after performing an etch process, followed by a removal of the mandrel 102 to expose the underlying surface of the substrate 101. However, due to the conformal shape of the first layer 103, the top portions of the mask 106 have rounded corners 104 and the bottom portions of the mask 106 have a foot 105. This foot 105 may comprise residual material from the first layer 103 that was not entirely removed during the etch process. In particular, the smaller thickness of the first layer 103 relative to the height of the mandrel 102 (resulting in a high aspect ratio and dense pitch) result in the formation of abnormalities that are not usually observed in large sized features. As device features scale below 28 nm, the spacer shoulder rounding defects (e.g., rounded corners 104) and footing defects (e.g., foot 105) become more significant as a percentage of pattern defectivity. For example, this percentage may be vary from 5% to as large as 50% having a significant contribution to yield loss. In other words, shoulder rounding and footing defects become increasingly more important with every subsequent generation due to smaller dimension patterns.

FIG. 1C illustrates a feature 107 formed after patterning the substrate 101 with the mask 106. Because of the anisotropic nature of the etching process used to form the feature 107, the abnormalities from the mask 106 get propagated into the feature 107. Thus, instead of vertical sidewalls, the critical dimension of the feature 107 varies significantly along its thickness. These defects may become further compounded with other fabrication issues, such as misalignment between the multiple patterning steps, and cause product yield loss.

An embodiment of forming a semiconductor device will be described using FIGS. 2A-4B along with the flow chart of FIGS. 7 and 11B. Another embodiment of forming a semiconductor device will be described using FIGS. 5A-6B along with the flow chart of FIGS. 7 and 11B. Another embodiment of forming a semiconductor device will be described using FIGS. 8A-10B along with the flow chart of FIGS. 11A-11B.

FIGS. 2A-4B illustrate a semiconductor device during various stages of fabrication in accordance with an embodiment of the present invention.

Figure 2A:
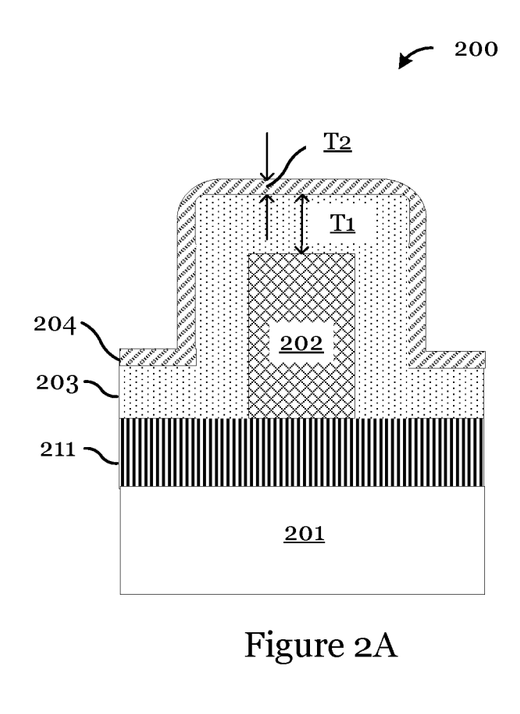
FIG. 2A illustrates a cross-sectional view of a semiconductor device during fabrication after forming multiple conformal layers over a mandrel.

FIG. 2A illustrates a cross-sectional view of a semiconductor device during fabrication after forming multiple conformal layers over a mandrel 202.

Referring to FIG. 2A, the semiconductor device 200 at this stage of processing includes a substrate 201 with a to-be-patterned layer 211 which is to be patterned using a multiple patterning process such as quadruple or dual patterning. In various embodiments, the feature to be formed may be a contact hole, metal line, gate line, isolation regions, and other such feature that is being formed using a self-aligned multiple patterning lithographic process.

The substrate 201 may comprise silicon, silicon germanium, silicon carbide, and compound semiconductors such as gallium nitride, gallium arsenide, indium arsenide, indium phosphide, and others. The substrate 201 may comprise a semiconductor wafer that may include a semiconductor epitaxial layer including hetero epitaxial layers. For example, in one or more embodiments, one or more hetero epitaxial layers comprising a compound semiconductor may be formed over a semiconductor substrate. In various embodiments, a portion or an entirety of the substrate 201 may be amorphous, polycrystalline, or single-crystalline. In various embodiments, the substrate 201 may be doped, undoped, or contain both doped and undoped regions.

In various embodiments, the mandrel 202 may be formed using lithographic patterning technique such as self-aligned double patterning (SADP), self-aligned quadruple patterning (SAQP), or any other multiple patterning techniques known within the state of the art. In various embodiments, the mandrel 202 has a feature size that necessitates the use of electron beam lithography or extreme ultraviolet lithography. In one exemplary embodiment, the mandrel 202 may be formed in the first lithographic step of a multiple patterning technique. In other embodiments, the mandrel 202 may be a subsequent intermediate feature, e.g., formed as a consequence of pitch doubling. In various embodiments, the mandrel 202 may comprise hard mask materials, soft mask materials, or photoresist materials. In one embodiment, the mandrel 202 comprises porous silicon, or any other type of sacrificial material known within the art.

As will be clear from the fabrication process further described, mandrels are intermediate structures used to form etch masks and define the distance between adjacent features, such as etch masks or other mandrels.

In various embodiments, the first etch mask layer 203 is formed by a deposition process such as atomic layer deposition (ALD) or any other conformal deposition technique used within semiconductor device fabrication. The first etch mask layer 203 may comprise silicon oxide (SiOx), silicon dioxide, or any other type of oxide or insulating material known within the art. In further embodiments, the first etch mask layer 203 may comprise silicon, silicon nitride, metal oxide, metal nitride, metal, carbon, organic materials, and other semiconductor materials such as SiGe, Ge, GaAs, SiC, GaN.

Unlike a conventional process, in accordance with embodiments of the present invention, a second etch mask layer 204 is formed over the first etch mask layer 203. The second etch mask layer 204 comprises a different material than the first etch mask layer 203. In various embodiments, the second etch mask layer 204 may comprise silicon nitride (SiN), titanium oxide (TiOx), tantalum nitride, titanium nitride, a metal oxide, a metal nitride, or any other similar material (different than the first layer 203) known to the art. In further embodiments, the second etch mask layer 204 may comprise silicon, metal, carbon, organic materials, and other semiconductor materials such as SiGe, Ge, GaAs, SiC, GaN.

In various embodiments, the second etch mask layer 204 may comprise materials that have a slower etch rate (at least two times slower) than the etch rate of the material comprising the first etch mask layer 203. In some embodiments, the second etch mask layer 204 may be a sacrificial layer and may be subsequently removed after the multiple patterning process.

According to various embodiments, the second etch mask layer 204 may be formed by a deposition process, such as atomic layer deposition (ALD). In one or more embodiments, the deposition process may be a conformal deposition process.

In other embodiments, the deposition process may be partially selective. Therefore, a first portion of the second etch mask layer 204 on top of the to-be-patterned layer 211 and a second portion of the second etch mask layer 204 on top of the first etch mask layer 203 may have a different thickness. In addition, the second etch mask layer 204 may have a different thickness than the first etch mask layer 203. For example, the second etch mask layer 204 may have a thickness that is up to 50% different than the to-be-patterned layer 211 and the first etch mask layer 203. According to various embodiments, a ratio of the first thickness T1 of the first etch mask layer 203 to the second thickness T2 of the second etch mask layer 204 is about 2:1 to about 20:1. In various embodiments, the ratio of the first thickness T1 of the first etch mask layer 203 to the second thickness T2 of the second etch mask layer 204 is determined by the etching performance difference between the different films and the resulting spacer pattern profile after etch. The multiple layers of deposition materials can be discretely different materials or gradients of composition change, depending on what provides the best final profile after the etch.

Figure 2B:
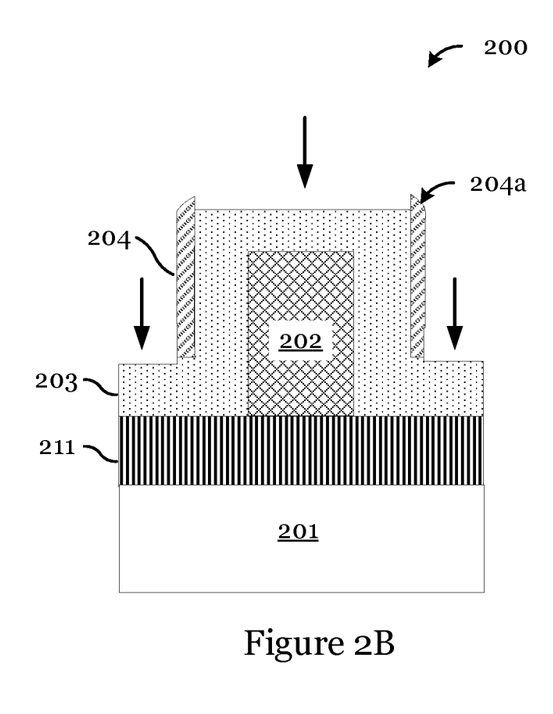
FIG. 2B illustrates a cross-sectional view of a semiconductor device during fabrication after etching through the second etch mask layer.

FIG. 2B illustrates a cross-sectional view of a semiconductor device during fabrication after etching through the second etch mask layer 204 in accordance with an embodiment of the present invention.

As illustrated in FIG. 2B, the second etch mask layer 204 is etched using an anisotropic plasma etching process. In various embodiments, the anisotropic etch process used to etch the first etch mask layer 203 and the second etch mask layer 204 may involve a dry etching technique, such as reactive ion etching (RIE).

This process removes portions of the second etch mask layer 204 over the first etch mask layer 203, leaving a spacer sidewall. The etching is not stopped after the removal of the second etch mask layer 204 but is allowed to progress further without a change in etch chemistry. As a consequence, as shown by the arrows, the first etch mask layer 203 begins to etch.

As previously noted, the second etch mask layer 204 is selected to etch slower than the first etch mask layer 203 when exposed to a plasma process for performing an anisotropic etch. In various embodiments, the etch rate and etch directional differences between the first etch mask layer 203 and second etch mask layer 204 may be achieved by the combining effects of material selection and etch chemistry tuning. The etch chemistry may include gases such as fluorocarbon, hydrofluorocarbon, hydrocarbon, fluorine-based gas, bromine-based gas, chlorine-based gas, hydrogen, oxygen, nitrogen, argon and helium. The other process parameters during this plasma process may be in the range for pressure of 1 mTorr to 500 mTorr, temperature of $-20°$ C. to $160°$ C., and radio frequency power of 0 W to 2000 W.

Therefore, once the second etch mask layer 204 is removed to expose the underlying portions of the first etch mask layer 203, the etching rate increases as the first etch mask layer 203 begins to etch.

However, due to the differences in etching rates, the outer top corners 204a of the second etch mask layer 204 are not removed as fast as the exposed top surfaces of the first etch mask layer 203. For example, as illustrated in FIG. 2B, as the etching continues past the removal of the second etch mask layer 204, the first etch mask layer 203 is undercut leaving a protective sidewall formed by the second etch mask layer 204.

Figure 3A:
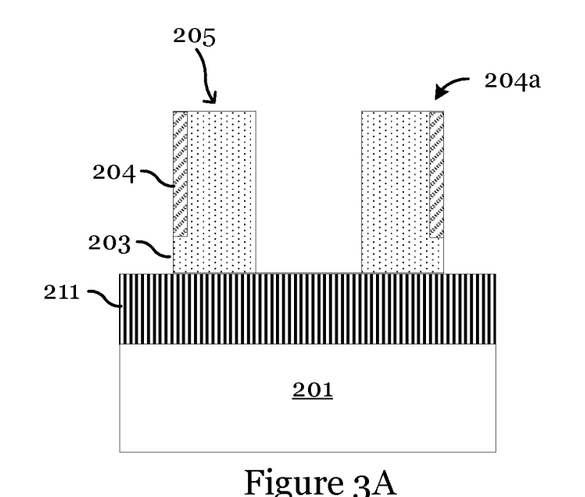
FIGS. 3A and 3B illustrate a semiconductor device during a subsequent stage of fabrication after forming a double layered etch mask (also called aSADP spacer)
Figure 3B:
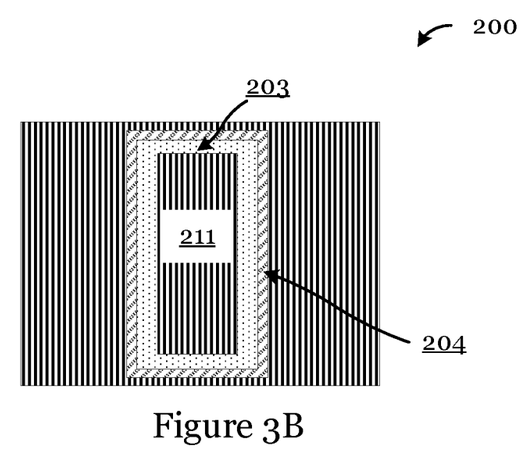

FIGS. 3A and 3B illustrate a semiconductor device during a subsequent stage of fabrication after forming a double layered etch mask 205 in accordance with an embodiment of the present invention, wherein FIG. 3A illustrates a cross-sectional view and FIG. 3B illustrates a top view.

As described above, due to the different etching rates of the first etch mask layer 203 and the second etch mask layer 204, the resulting double layered etch mask 205 has less rounding of the outer top corners 204a and an overall sharper spacer edge. In addition, the sidewalls of the double layered etch mask 205 are vertical without any foot. This is because the first etch mask layer 203, located below the second etch mask layer 204, etches at a faster rate. Hence, the first etch mask layer 203 is completely removed without leaving any residues.

Accordingly, the double layered etch mask 205 has an outer sidewall profile that is much sharper and less rounded, and therefore free of abnormalities and defects. With a vertical sidewall, the double layered etch mask 205 may serve as a robust etch mask for subsequent etching steps by alleviating the propagation of unwanted artifacts (e.g., the rounded edges 104 and the foot 105 as illustrated in FIG. 1) into any underlying layer.

After forming the double layered etch mask 205, the mandrel 202 is removed to expose the underlying to-be-patterned layer 211. In various embodiments, the mandrel 202 may be removed using a wet etching process. Alternately, the mandrel 202 may be removed using an anisotropic plasma etch process, such as reactive ion etch (RIE), so that all of the etching processes may be performed in a single plasma etch chamber.

Figure 4A:
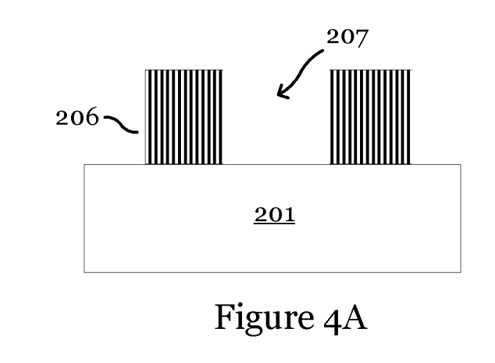
FIGS. 4A and 4B illustrate a semiconductor device during a subsequent stage of fabrication after using the double layered etch mask to pattern a feature.
Figure 4B:
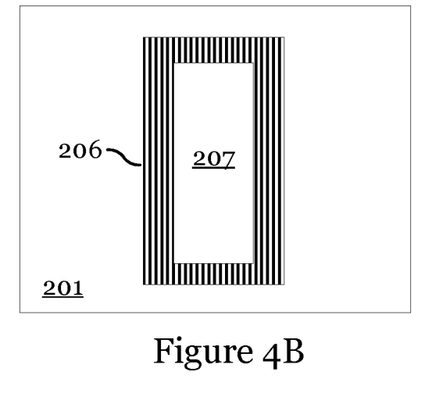

FIGS. 4A and 4B illustrate a semiconductor device during a subsequent stage of fabrication after using the double layered etch mask 205 to pattern a feature in accordance with an embodiment of the present invention, wherein FIG. 4A illustrates a cross-sectional view and FIG. 4B illustrates a top view.

The double layered etch mask 205 is used as an etch mask to pattern the to-be-patterned layer 211 below. The exposed (uncovered) regions 207 of the to-be-patterned layer 211 are etched and removed using an anisotropic etching process. The anisotropic etching process may be timed or stopped at an underlying (optional) etch stop layer. Any remaining portions of the double layered etch mask 205 may be removed after the etching. After completion of the anisotropic etching process, the resulting structure is a patterned feature 206. The patterned feature 206 comprises sharper outer sidewalls with more of a vertical profile that run parallel to one another, as opposed to an angled outer sidewall profile that comprises CD variation along the thickness.

Subsequent processing can proceed as in a conventional process flow with the formation of subsequent features and eventually the semiconductor device including all active and passive devices including metallization layers to interconnect these devices.

FIGS. 5A-6B illustrate a semiconductor device during various stages of fabrication in accordance with another embodiment of the present invention.

Unlike the prior embodiment described above, this embodiment includes more layers to form the etch mask. This provides another degree of freedom to tailor the shape of the etch mask being formed from the mandrel.

Figure 5A:
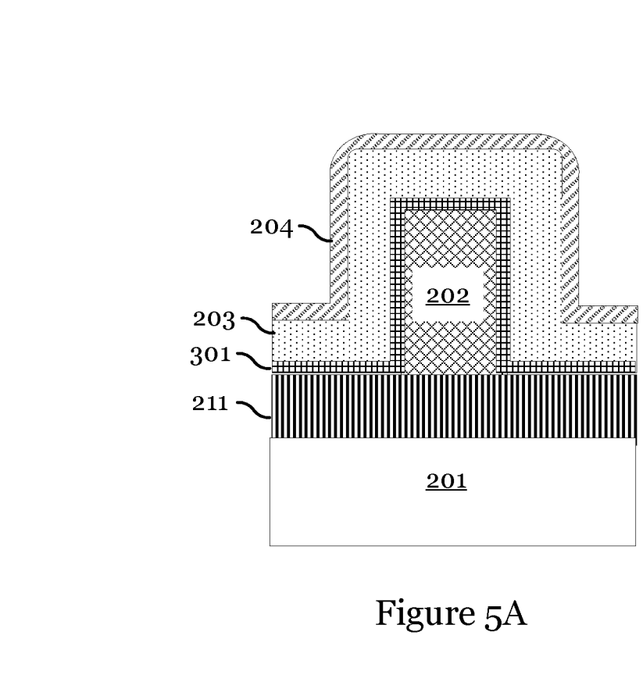
Figure 5B:
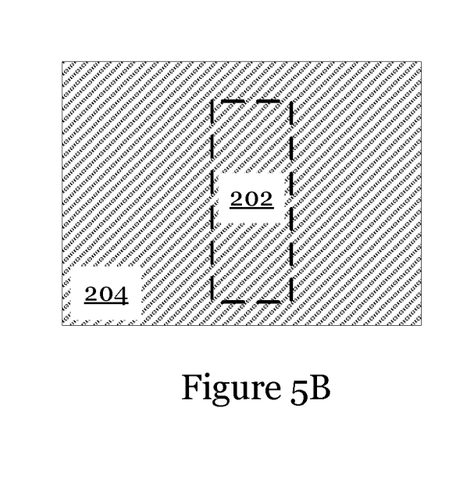

Accordingly, FIG. 5A and FIG. 5B illustrate the fabrication process for the semiconductor device after forming multiple conformal layers over a mandrel 202; all in accordance with embodiments of the present invention, wherein FIG. 5B illustrates a cross-sectional view and FIG. 5B illustrates a top view.

As in prior embodiments, FIG. 5A illustrates a stage of processing for the semiconductor device 300 in which a to-be-patterned layer 211 has been formed over a substrate 201, whereon a mandrel 202 has been fabricated above the to-be-patterned layer 211. Unlike the prior embodiments, a protective layer 301 is formed over the mandrel 202, for example, using a conformal deposition process. After forming the protective layer 301, the first etch mask layer 203 is formed over the protective layer 301. Subsequently, a second etch mask layer 204 is formed over the first etch mask layer 203.

In various embodiments, the substrate 201, the to-be-patterned-layer 211, the mandrel 202, the first etch mask layer 203, and the second etch mask layer 204 may be formed as previously described above.

Unlike the conventional process flow, according to embodiments of the present invention, the protective layer 301 is used to control the bottom shape of the triple layered etch mask (being formed) by helping to eliminate/avoid the unwanted foot 105 (which is discussed above). Accordingly, the protective layer 301 may comprise materials possessing a faster etch rate than the etch rate of the first etch mask layer 203. In one embodiment, the etch rate of the protective layer 301 is at least ten times the etch rate of the first etch mask layer 203. In another embodiment, the etch rate of the protective layer 301 is at least two times the etch rate of the first etch mask layer 203. Accordingly, in various embodiments, the protective layer 301 may include aluminum (Al), hafnium (Hf), titanium (Ti), or any other material known to the art which possesses a faster etch rate than the etch rate of the first etch mask layer 203. In another application, the protective layer 301 may also serve as an etch stop layer for the first etch mask layer 203/the second etch mask layer 204 the to-be-patterned-layer 211 can cause pattern transfer defects in subsequent patterning etches. Also, the protective layer 301 can be selected for film stress properties to prevent tilting or sagging of the spacer structure comprising the first etch mask layer 203/the second etch mask layer 204. As an etch stop or stress support film, the protective layer 301 may be defined by specific etch properties and selectivities to support the purpose. For example, as an etch stop, the protective layer 301 will not etch in the etch chemistry that etches the first etch mask layer 203, but will be capable of etching in a different chemistry that does not etch the first etch mask layer 203 to remove the footing defect.

In various embodiments, the protective layer 301 may be formed by a conformal deposition process, such as atomic lay deposition (ALD). In various embodiments, the ALD fabrication step may be a process that deposits with less aggressive oxidants (e.g., $O_3$, $H_2O$, $H_2O_2$, thermal $O_2$, and others) that do not damage the neighboring photoresist.

In various embodiments, the protective layer 301 may have a thickness ranging from 1 nm to 5 nm, the first etch mask layer 203 may have a thickness ranging from 5 nm to 20 nm, the second etch mask layer 204 may have a thickness ranging from 1 nm to 5 nm. In various embodiments, all layers in the multi-layer spacer including the protective layer 301, the first etch mask layer 203, and the second etch mask layer 204 in the example, may be defined by an optimum thickness based on the selected etch process.

In various embodiments, the protective layer 301, the first etch mask layer 203, and the second etch mask layer 204 may be formed in a single deposition process. For example, during the deposition, different gases may be introduced to change the deposition conditions. Alternately, the process chemistry may be changed more dynamically by controlling or changing other parameters like plasma power, deposition rate, pressure and/or temperature of the deposition chamber. As a consequence, in some embodiments, a compositional gradient may be established based on properties of the etch chemistry. In other words, the composition of the protective layer 301, the first etch mask layer 203, and the second etch mask layer 204 may be tailored to produce a substantially vertical sidewall as next illustrated in FIG. 6A.

Figure 6A:
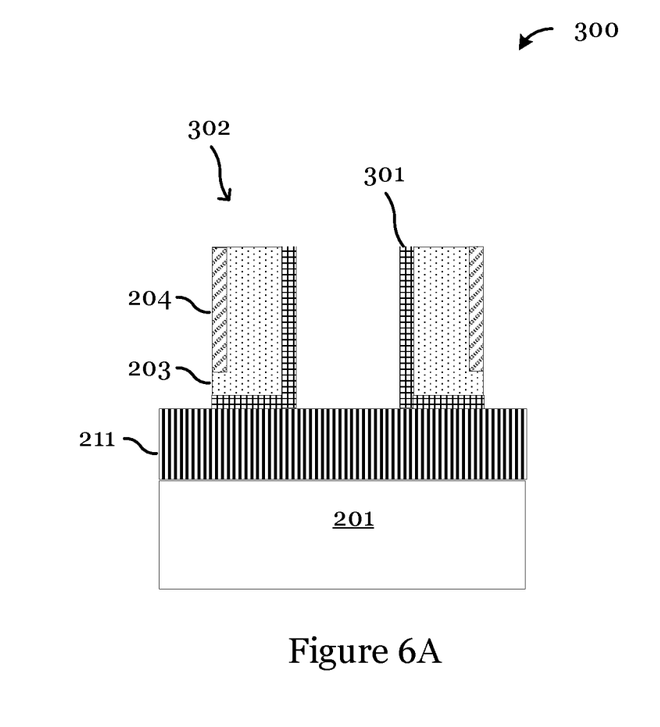
FIG. 6A-6B illustrate the semiconductor device after forming a triple layered etch mask and after removing the mandrel.
Figure 6B:
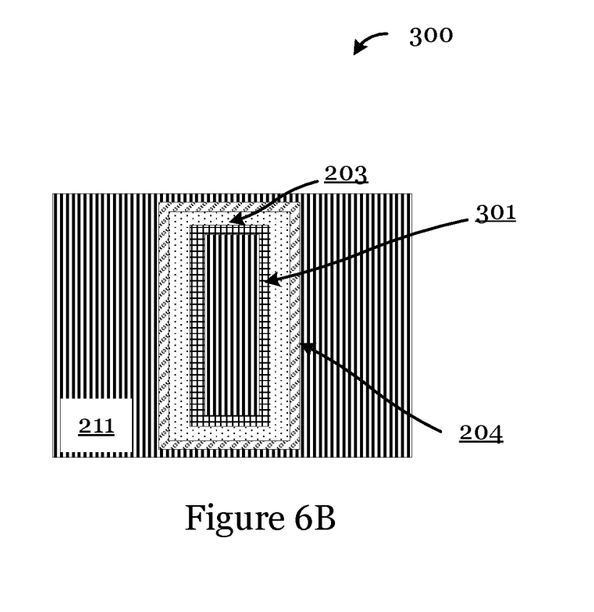

FIG. 6A illustrates the semiconductor device after forming a triple layered etch mask 302 comprising the protective layer 301, the first etch mask layer 203, and the second etch mask layer 204, and after removing the mandrel 202 to expose the underlying surface of the to-be-patterned layer 211.

According to various embodiments, the triple layered etch mask 302, which is comprised of a protective layer 301, a first etch mask layer 203 and a second etch mask layer 204, may be patterned using a dry etching technique such as RIE. Likewise, the mandrel 202 may be removed through similar methods as described above.

Subsequent processing may follow as described in prior embodiments. For example, a second anisotropic etch is performed in which the triple layered etch mask 302 is used to form a feature within the underlying to-be-patterned layer 211. The resulting structure resembles the patterned feature shown in FIG. 4A, which comprises vertical sidewalls (as opposed to the angled sidewalls shown in FIG. 1A).

Figure 7:
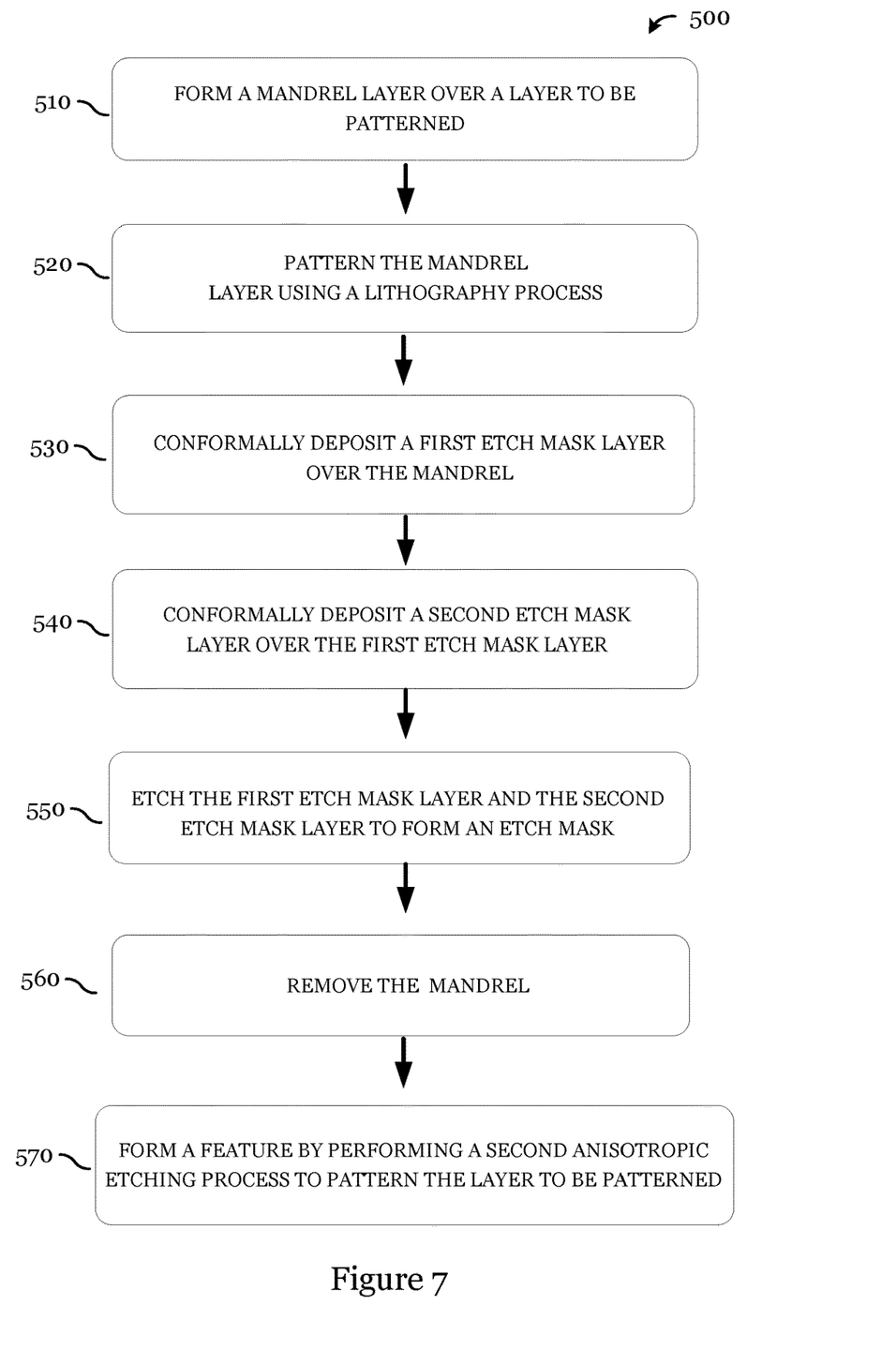
FIG. 7 illustrates one example embodiment of a method for forming a semiconductor device.

FIG. 7 illustrates one example embodiment of a method 500 for forming a semiconductor device. The method 500 comprises forming a mandrel over a to-be-patterned layer (box 510) and patterning the mandrel using a lithography process (box 520). A first etch mask layer is deposited over the mandrel (box 530), which may be conformal or partially selective in some embodiments.

A second etch mask layer is deposited over the first etch mask layer (box 540) as described using FIG. 2A. The second etch mask layer may be deposited using a conformal deposition process or a partially selective deposition process in various embodiments. Using a first anisotropic etching process, the first etch mask layer and the second etch mask layer are etched to form an etch mask comprising the first etch mask layer and the second etch mask layer (box 550), as described using FIGS. 2B and 3A-3B or FIG. 6A.

The mandrel is removed to expose an underlying surface of the to-be-patterned layer (box 560), as described using FIG. 3A. Using the etch mask, a feature is formed by performing a second anisotropic etching process to pattern the to-be-patterned layer (box 570), as described using FIG. 4A. As described above in various embodiments, during the second anisotropic etching process, the first etch mask layer etches at a first rate and the second etch mask layer etches at a second rate, where the first rate is different from the second rate.

In various embodiments, the first anisotropic etching process may be changed with the composition of the first etch mask layer and the composition of the second etch mask layer to form the etch mask having a predefined shape. For example, the etching gases, biasing schemes, and other etch conditions may be changes as the etching exposes surfaces of different compositions. In some embodiments, the outer films such as the triple layered etch mask 302 or the second etch mask layer 204 may be optionally removed after the spacer shape is obtained having vertical sidewalls.

FIGS. 8A-10B illustrate a semiconductor device 400 during various stages of fabrication, wherein FIGS. 8A-10A illustrate the cross-sectional views and FIGS. 8B-10B illustrate the top views; all in accordance with embodiments of the present invention.

Figure 8A:
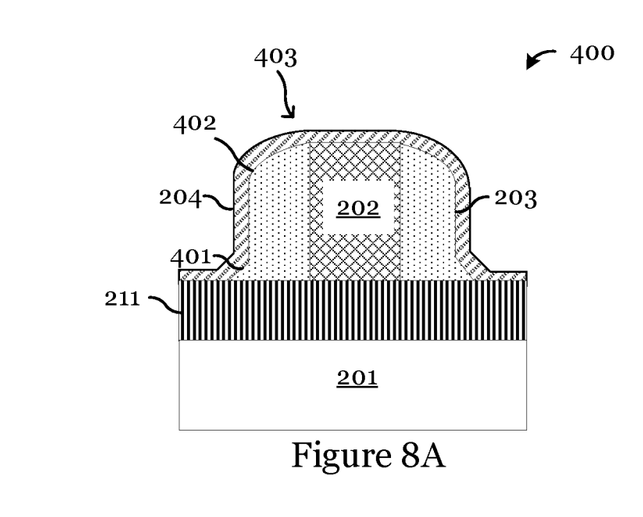
Figure 8B:
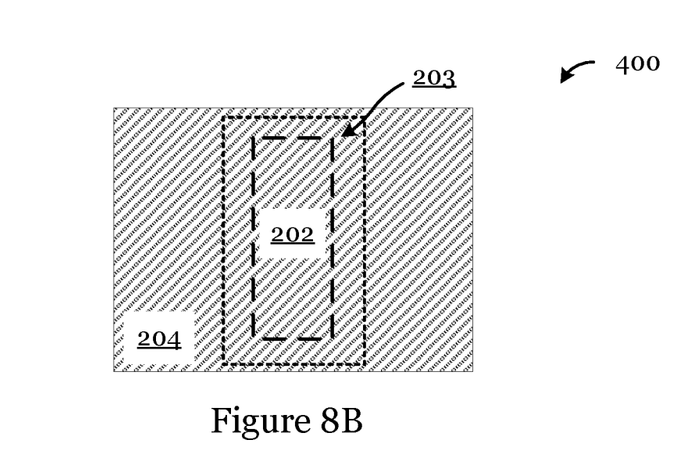

FIG. 8A illustrates a cross-sectional view of a semiconductor device 400 during fabrication after etching the first etch mask layer 203 with a first anisotropic etch process so as to form an intermediate spacer structure 403. FIG. 8B illustrates a corresponding top view.

As described in prior embodiments, a mandrel 202 is formed over a to-be-patterned layer 211 disposed on a substrate 201. A first etch mask layer 203 is deposited over the mandrel 202 as in prior embodiments. Unlike the prior embodiments, the first etch mask layer 203 is etched using an anisotropic etching process.

Because the etching is performed of a single material, the resulting intermediate spacer structure 403 is formed with a bottom foot 401 and a rounded top edge 402. In this embodiment of the invention, before removing the mandrel 202, additional layers are deposited and processed to remove the bottom foot 401 and the rounded top edge 402 as further described below.

Following the first anisotropic etch process, a second etch mask layer 204 is deposited over the intermediate spacer structure 403 and the mandrel 202. The second etch mask layer 204 may be formed using a conformal deposition process in one embodiment. In various embodiments, the second etch mask layer 204 is deposited using a process that has low selectivity between the mandrel 202 and the to-be-patterned layer 211 so that a variation in the thickness of the second etch mask layer 204 is less than 20%.

In various embodiments, the substrate 201, the to-be-patterned layer 211, the mandrel 202, the first etch mask layer 203, and the second etch mask layer 204 is as described earlier.

Figure 9A:
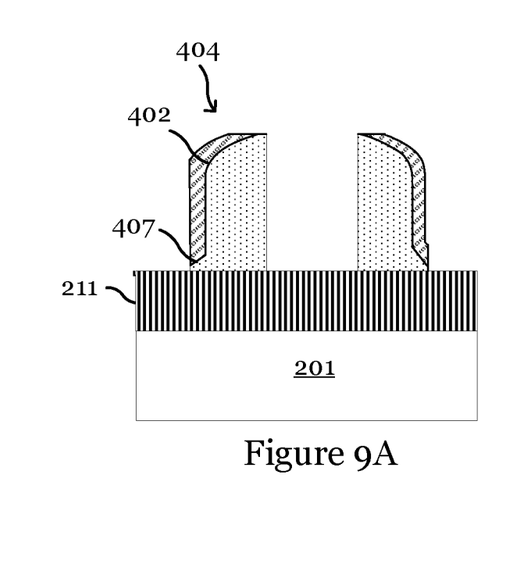
Figure 9B:
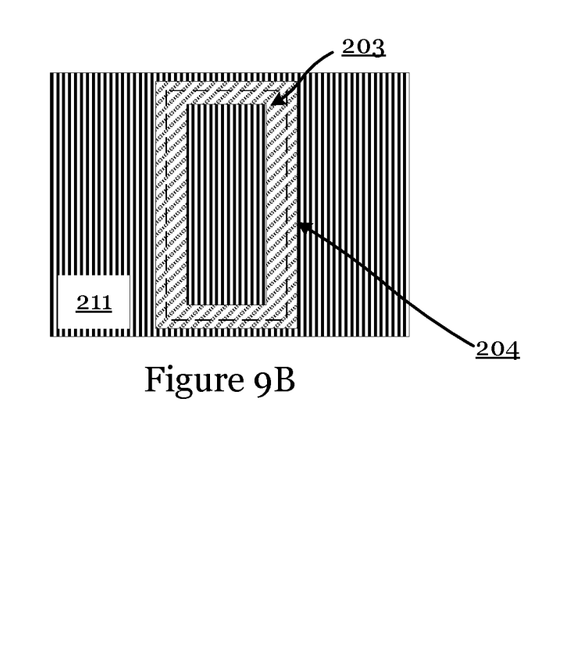

FIG. 9A illustrates a cross-sectional view of a semiconductor device 400 during fabrication after etching the second etch mask layer 204 to expose a top surface of the mandrel 202 and after subsequently removing the mandrel, wherein FIG. 9B illustrates a corresponding top view.

In various embodiments, the second etch mask layer 204 may be etched using a dry etching process, such as RIE. As the second etch mask layer 204 is etched using an anisotropic etch process, the bottom foot 401 is partially removed as illustrated in the Figure while retaining a slanted surface 407. Likewise, the mandrel 202 may be removed through similar techniques as described above.

Figure 10A:
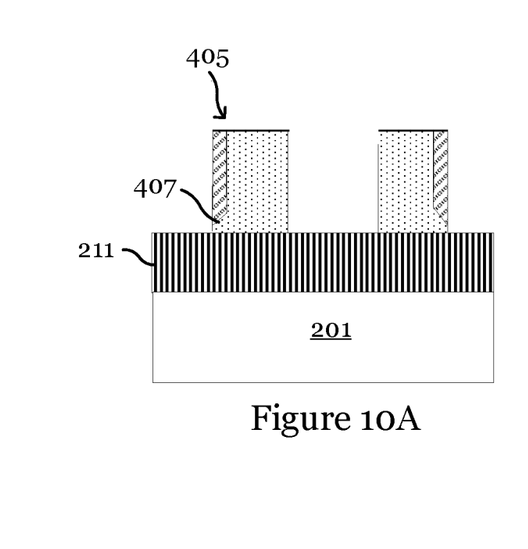
FIGS. 10A-10B illustrate a semiconductor device during fabrication after performing a third anisotropic etching process.
Figure 10B:
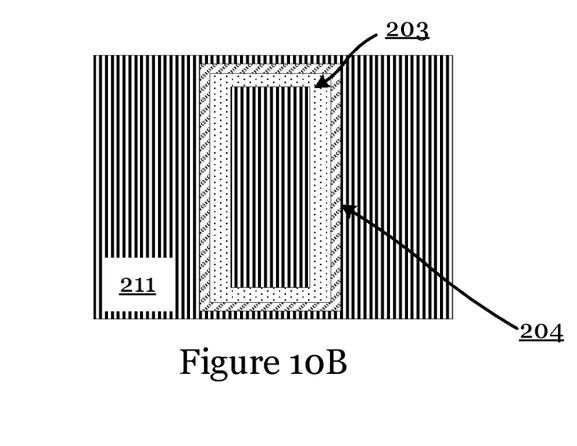

FIG. 10A illustrates a cross-sectional view of a semiconductor device 400 during fabrication after performing a third anisotropic etching process, wherein FIG. 10B illustrates a corresponding top view. In various embodiments, the third anisotropic etching process is configured to improve the shape of the etch mask 404 by etching away the rounded top edge 402 (illustrated in FIG. 9A). In various embodiments, the third anisotropic etch may be a RIE process. The third anisotropic etching process or chemical mechanical polishing (CMP) process etches down the first etch mask layer 203 and the second etch mask layer 204 so as to planarize the surface, which reduces or even eliminates the rounded top edge 402. In some alternative embodiments, a planarization process may be used.

The etch mask thus formed comprises vertical sidewalls and may be used to pattern subsequent features. While not depicted, a fourth anisotropic etch is performed during the next fabrication step, in which the etch mask 405 is used to form a feature in the underlying to-be-patterned layer 211. The resulting structure resembles the feature as shown in FIG. 4A, which comprises vertical sidewalls (as opposed to the angled sidewalls shown in FIG. 1C).

According to embodiments of the present invention, all thicknesses of various layers are configurable and may be optimized to achieve desired device characteristics, feature shapes, or structures. Likewise, all material compositions may be optimized along the same fashion to achieve desired device characteristics, feature shapes, or structures.

According to embodiments of the present invention, the various layers can be formed by deposition or post deposition modification, such as via nitridation or via doping.

According to embodiments of the present invention, the various layers comprising the etch mask can be designed to provide the desired etch mask shape and device characteristics using a single etch condition, or multiple etch conditions. Likewise, individual etch conditions can be optimized for each specific layer.

Figure 11A:
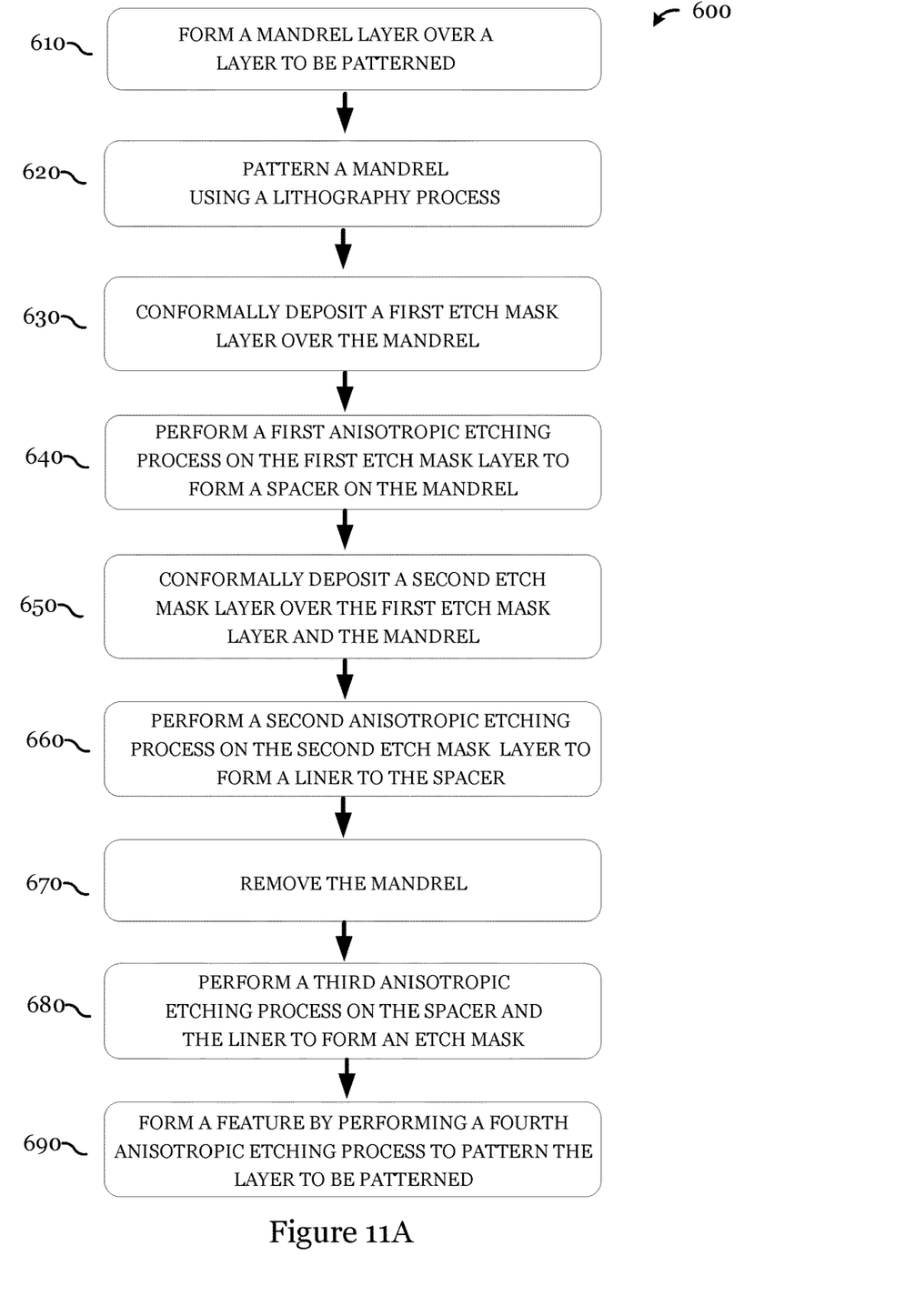
FIG. 11A-11B illustrate example embodiments of a method for forming a semiconductor device.

FIG. 11A illustrates another example embodiment of a method 600 for forming a semiconductor device, the method 600 comprises forming a mandrel over a to-be-patterned layer (box 610) and patterning the mandrel using a lithography process (box 620). A first etch mask layer is deposited over the mandrel (box 630), which in some embodiments may be deposited conformally or partially selectively. Using a first anisotropic etching process, the first etch mask layer is etched to form an intermediate spacer structure 403 around the mandrel (box 640) as described using FIG. 8A.

A second etch mask layer is deposited over the first etch mask layer and the mandrel (box 650) as described using FIG. 8A, which in some embodiments may be deposited conformally or partially selectively. Using a second anisotropic etching process, the second etch mask layer is etched to form a liner to the spacer (box 660) as described using FIG. 9A. The mandrel is removed to expose an underlying surface of the to-be-patterned layer (box 670), as described using FIG. 9A.

Using a third anisotropic etching process, the spacer and the liner are used to form an etch mask (box 680), as described using FIG. 10A. Using the etch mask, a feature is formed by performing a fourth anisotropic etching process to pattern the to-be-patterned layer (box 690). As described above in various embodiments, during the third anisotropic etching process, the first etch mask layer etches at a first rate and the second etch mask layer etches at a second rate, where the first rate is different from the second rate.

In various embodiments, the third anisotropic etching process may change with the composition of the spacer and the composition of the liner to form the etch mask having a predefined shape. For example, the etching gases, biasing schemes, and other etch conditions may be changed as the etching exposes surfaces of different compositions. In some embodiments, the outer films such as the triple layered etch mask 302 or the second etch mask layer 204 may be optionally removed after the spacer shape is obtained having vertical sidewalls.

Figure 11B:
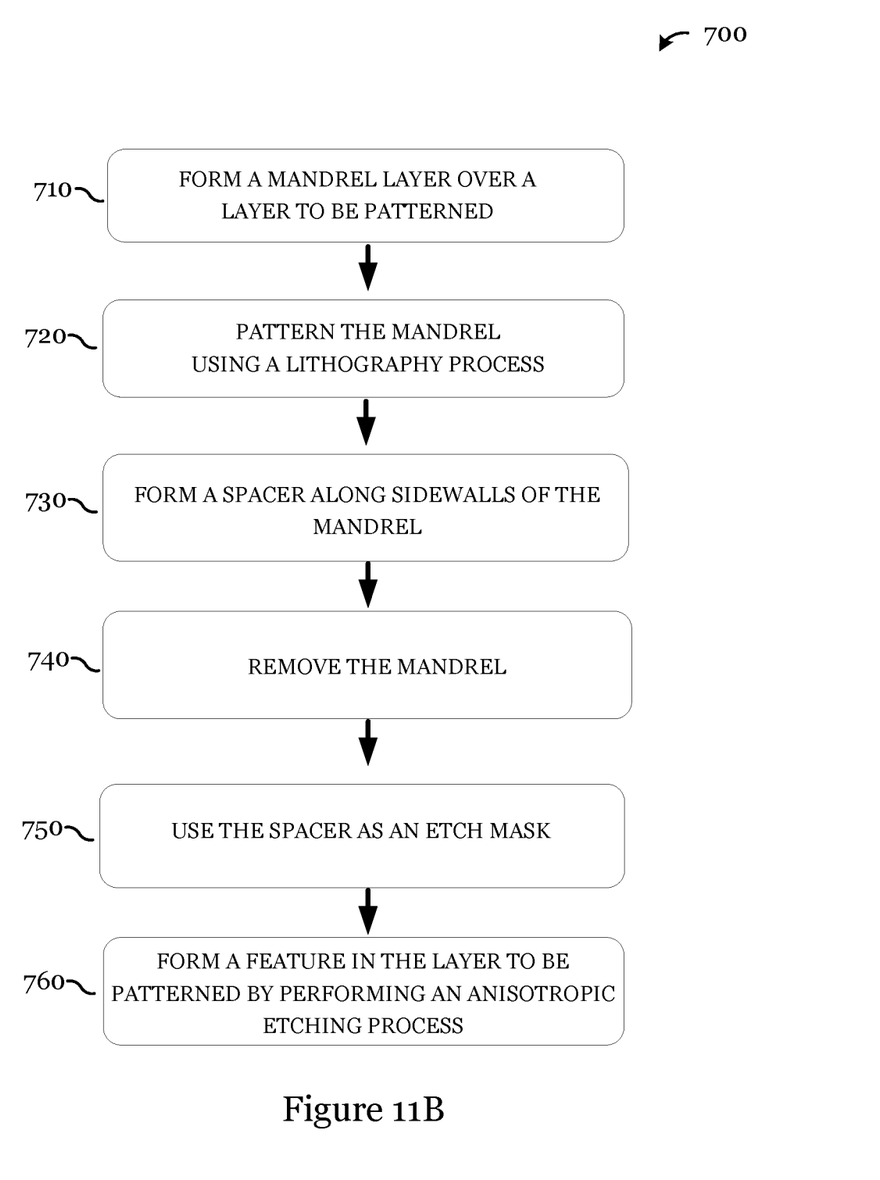

FIG. 11B illustrates another example embodiment of a method 700 for forming a semiconductor device, the method 700 comprises forming a mandrel over a to-be-patterned layer (box 710) and patterning the mandrel using a lithography process (box 720).

A spacer is formed over the mandrel (box 730), for example, as described using FIG. 3A, 6A, or 10A. The spacer comprises a first sidewall comprising a first material and a second sidewall comprising a second material different from the first material, where the first sidewall and the second sidewall are vertical and parallel to each other. The mandrel is removed to expose an underlying surface of the to-be-patterned layer (box 740).

The spacer is then used as an etch mask (box 750). Using the etch mask, a feature is formed by performing an anisotropic etching process to pattern the to-be-patterned layer (box 760). As described above in various embodiments, the first sidewall and the second sidewall comprise no bottom foot, for example, as described using FIG. 3A, 6A, or 10A. Likewise, the first sidewall and the second sidewall comprise only a planar surface with no curved surface, for example, as described using FIG. 3A, 6A, or 10A.

Example embodiments of the invention are summarized here. Other embodiments can also be understood from the entirety of the specification as well as the claims filed herein.

Example 1. A method of forming a device includes forming a mandrel layer over a layer to be patterned and patterning the mandrel layer to form a mandrel using a lithography process. The method includes depositing a first etch mask layer over the mandrel. The method includes depositing a second etch mask layer over the first etch mask layer. The method includes, using a first anisotropic etching process, etching the first etch mask layer and the second etch mask layer to form an etch mask including the first etch mask layer and the second etch mask layer. The method includes removing the mandrel to expose an underlying surface of the layer to be patterned. The method includes, using the etch mask, forming a feature by performing a second anisotropic etching process to pattern the layer to be patterned, where during the second anisotropic etching process, the first etch mask layer etches at a first rate and the second etch mask layer etches at a second rate, and where the first rate is different from the second rate.

Example 2. The method of example 1, where the first etch mask layer and the second etch mask layer are deposited using a conformal deposition process.

Example 3. The method of one of examples 1 or 2, where the first rate is at least two times the second rate.

Example 4. The method of one of examples 1 to 3, where the first etch mask layer includes silicon oxide and the second etch mask layer includes silicon nitride or titanium oxide.

Example 5. The method of one of examples 1 to 4, where the first etch mask layer includes silicon and the second etch mask layer includes a metal.

Example 6. The method of one of examples 1 to 5, where the first anisotropic etching process is configured to change with the composition of the first etch mask layer and the composition of the second etch mask layer to form the etch mask having a predefined shape.

Example 7. The method of one of examples 1 to 6, further including: depositing a third etch mask layer before depositing the first etch mask layer; and where the first anisotropic etching process includes etching the third etch mask layer, where the etch mask includes the first etch mask layer, the second etch mask layer, and the third etch mask layer, where during the first anisotropic etching process, the third etch mask layer etches at a third rate, and where the third rate is different from the second rate.

Example 8. The method of one of examples 1 to 7, where the third rate is at least two times the first rate and the first rate is at least two times the second rate.

Example 9. The method of one of examples 1 to 8, where the first layer and the third layer include the same material.

Example 10. A method of forming a device includes forming a mandrel over a layer to be patterned and depositing a first etch mask layer over the mandrel. The method includes, using a first anisotropic etching process, etching the first etch mask layer to form a spacer on the mandrel. The method includes depositing a second etch mask layer over the first etch mask layer and the mandrel. The method includes, using a second anisotropic etching process, etching the second etch mask layer to form a liner over the spacer. The method includes removing the mandrel to expose an underlying surface of the layer to be patterned. The method includes, using a third anisotropic etching process, etching the spacer and the liner to form an etch mask including the first etch mask layer and the second etch mask layer. The method includes, using the etch mask, forming a feature by performing a fourth anisotropic etching process to pattern the layer to be patterned. During the fourth anisotropic etching process, the first etch mask layer etches at a first rate and the second etch mask layer etches at a second rate, and where the first rate is different from the second rate.

Example 11. The method of example 10, where the first etch mask layer and the second etch mask layer are deposited using a conformal deposition process.

Example 12. The method of one of examples 10 or 11, where the second rate is at least two times the first rate.

Example 13. The method of one of examples 10 to 12, where the first etch mask layer includes silicon oxide and the second etch mask layer includes silicon nitride.

Example 14. The method of one of examples 10 to 13, where the first etch mask layer includes silicon oxide and the second etch mask layer includes titanium oxide.

Example 15. The method of one of examples 10 to 14, where the first layer includes silicon and the second layer includes a metal.

Example 16. The method of one of examples 10 to 15, where the third anisotropic etching process is configured to change with the composition of the spacer and the composition of the liner to form the etch mask having a predefined shape.

Example 17. A method of forming a device includes forming a mandrel over a layer to be patterned and forming a spacer along sidewalls of the mandrel. The spacer includes a first sidewall including a first material and a second sidewall including a second material different from the first material. The first sidewall and the second sidewall are vertical and parallel to each other. The method includes removing the mandrel after forming the spacer. The method includes, using the spacer as an etch mask, forming a feature in the layer to be patterned using an anisotropic etching process.

Example 18. The method of example 17, where the first sidewall and the second sidewall include no foot.

Example 19. The method of one of examples 17 or 18, where the first sidewall and the second sidewall include only a planar surface with no curved surface.

Example 20. The method of one of examples 17 to 19, where forming the mandrel includes using electron beam lithography or extreme ultraviolet lithography.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a device, the method comprising:
   forming a mandrel layer over a layer to be patterned;
   patterning the mandrel layer to form a mandrel using a lithography process;
   conformally depositing a first etch mask layer of a first thickness along sidewalls of the mandrel and extending over a top surface of the mandrel;
   conformally depositing a second etch mask layer of a second thickness less than the first thickness over the first etch mask layer after depositing the first etch mask layer, the first etch mask layer extending over the mandrel between the top surface and the second etch mask layer;
   using a first anisotropic etching process, simultaneously etching the first etch mask layer and the second etch mask layer to form an etch mask comprising the first etch mask layer and the second etch mask layer;
   removing the mandrel to expose an underlying surface of the layer to be patterned; and
   using the etch mask, forming a feature by performing a second anisotropic etching process to pattern the layer to be patterned,
      wherein during the first anisotropic etching process, the first etch mask layer etches at a first rate and the second etch mask layer etches at a second rate,
      wherein the first rate is faster than the second rate, and
      wherein forming the etch mask comprises sharpening rounded corners of the etch mask using the differential between the first rate and the second rate.

2. The method of claim 1, wherein the first rate is at least two times the second rate.

3. The method of claim 1, wherein the first etch mask layer comprises silicon oxide and the second etch mask layer comprises titanium oxide.

4. The method of claim 1, wherein the first etch mask layer comprises silicon and the second etch mask layer comprises a metal.

5. The method of claim 1, further comprising:
   depositing a third etch mask layer before depositing the first etch mask layer; and
   wherein the first anisotropic etching process comprises etching the third etch mask layer, wherein the etch mask comprises the first etch mask layer, the second etch mask layer, and the third etch mask layer, wherein during the first anisotropic etching process, the third etch mask layer etches at a third rate, and wherein the third rate is different from the second rate.

6. The method of claim 5, wherein the third rate is at least two times the first rate and the first rate is at least two times the second rate.

7. The method of claim 5, wherein the first etch mask layer and the third etch mask layer comprise the same material.

8. The method of claim 1, wherein the first etch mask layer comprises silicon oxide and the second etch mask layer comprises silicon nitride.

9. A method of forming a device, the method comprising:
   forming a mandrel over a layer to be patterned;
   forming a spacer along sidewalls of the mandrel,
      wherein the spacer comprises a layer comprising a first material, a sidewall comprising a second material, and an additional sidewall comprising a third material disposed between the layer and the mandrel, the second material and the third material being different from the first material,
      wherein the layer comprises a first thickness and is disposed between the mandrel and the sidewall,
      wherein the sidewall comprises a second thickness less than the first thickness,
      wherein the layer and the sidewall are vertical and physically contacting each other,
      wherein the first material extends laterally beneath the sidewall;
   removing the mandrel after forming the spacer; and
   using the spacer as an etch mask, forming a feature in the layer to be patterned using an anisotropic etching process.

10. The method of claim 9, wherein the sidewall comprises no foot.

11. The method of claim 9, wherein the sidewall comprises only a planar surface with no curved surface.

12. The method of claim 9, wherein forming the mandrel comprises using electron beam lithography or extreme ultraviolet lithography.

13. The method of claim 9, wherein forming the spacer comprises:
   depositing a first etch mask layer over the mandrel;
   depositing a second etch mask layer over the first etch mask layer; and
   using a first anisotropic etching process, etching the first etch mask layer and the second etch mask layer to form the etch mask comprising the first etch mask layer and the second etch mask layer, wherein during the first anisotropic etching process, the first etch mask layer etches at a first rate and the second etch mask layer etches at a second rate, and wherein the first rate is different from the second rate.

14. The method of claim 13, wherein forming the spacer further comprises:
   depositing a third etch mask layer before depositing the first etch mask layer; and
   wherein the first anisotropic etching process comprises etching the third etch mask layer, wherein the etch mask comprises the first etch mask layer, the second etch mask layer, and the third etch mask layer, wherein during the first anisotropic etching process, the third etch mask layer etches at a third rate, and wherein the third rate is different from the second rate.

15. The method of claim 9, wherein forming the spacer comprises:
   simultaneously etching the first material at a first rate and the second material at a second rate that is slower than the first rate; and sharpening rounded corners of the spacer using the differential between the first rate and the second rate.

16. The method of claim 9, wherein the first material comprises silicon oxide and the second material comprises silicon nitride.

17. A method of forming a device, the method comprising:
- forming a mandrel layer over a layer to be patterned;
- patterning the mandrel layer to form a mandrel using a lithography process;
- conformally depositing a first etch mask layer of a first thickness along sidewalls of the mandrel and extending over a top surface of the mandrel;
- conformally depositing a second etch mask layer of a second thickness less than the first thickness over the first etch mask layer after depositing the first etch mask layer, the first etch mask layer extending over the mandrel between the top surface and the second etch mask layer;
- using a first anisotropic etching process, simultaneously etching the first etch mask layer at a first rate and the second etch mask layer at a second rate to form an etch mask comprising the first etch mask layer and the second etch mask layer,
  - wherein the first rate is at least two times the second rate, and
  - wherein forming the etch mask comprises sharpening rounded corners of the etch mask using the differential between the first rate and the second rate;
- removing the mandrel to expose an underlying surface of the layer to be patterned; and
- using the etch mask, forming a feature by performing a second anisotropic etching process to pattern the layer to be patterned.

18. The method of claim 17, further comprising:
depositing a third etch mask layer before depositing the first etch mask layer;
wherein the first anisotropic etching process comprises etching the third etch mask layer at a third rate to form the etch mask, the etch mask comprising the first etch mask layer, the second etch mask layer, and the third etch mask layer; and
wherein the third rate is at least two times the first rate.

19. The method of claim 17, wherein the first etch mask layer comprises silicon and the second etch mask layer comprises a metal.

20. The method of claim 17, wherein:
conformally depositing the first etch mask layer comprises conformally depositing a first material of the first thickness along sidewalls of the mandrel and extending over the top surface of the mandrel; and
conformally depositing the second etch mask layer comprises conformally depositing a second material of the second thickness over the first etch mask layer, the second material being different from the first material.

* * * * *